METHOD FOR TREATING THE SURFACE OF SEMICONDUCTOR DEVICES

Filed Nov. 4, 1968 3 Sheets-Sheet 1

T. Tokuyama K. Uehara, INVENTORS.

BY

Marmorek & Bierman, ATTORNEYS.

T. Tokuyama K. Uehara, INVENTORS.

BY

Marmorek & Bierman, ATTORNEYS.

T. Tokuyama, K. Uehara, INVENTORS.

BY

Marmorek & Bierman, ATTORNEYS.

United States Patent Office 3,532,539

Patented Oct. 6, 1970

3,532,539

METHOD FOR TREATING THE SURFACE OF SEMICONDUCTOR DEVICES

Takashi Tokuyama and Keijiro Uehara, Tokyo-to, Japan, assignors to Kabushiki Kaisha Hitachi Seisakusho, Tokyo-to, Japan, a joint-stock company of Japan

Continuation-in-part of application Ser. No. 398,632, Sept. 23, 1964. This application Nov. 4, 1968, Ser. No. 773,144

Int. Cl. H01l *1/10*

U.S. Cl. 117—201 3 Claims

ABSTRACT OF THE DISCLOSURE

In order to obtain the optimum electrical characteristics of pn junction in silicon semiconductor devices, the silicon substrate is first heat-treated in an oxidizing atmosphere containing oxygen so as to form an extremely thin film of silicon dioxide due to thermal oxidation, and then a silicon dioxide film obtained by pyrolytic decomposition of organo-oxy-silane is deposited on the surface of the silicon semiconductor devices.

CROSS-REFERENCE TO RELATED APPLICATION

This application is a continuation-in-part of our copending application Ser. No. 398,632 filed Sept. 23, 1964 and now abandoned, entitled "Method for Fabricating Semiconductor Devices."

BACKGROUND OF INVENTION

This invention relates to a method for treating the surface of a semiconductor device, and more particularly to passivation of the surface of the semiconductor devices such as diodes, transistors, integrated circuits, and the like.

As the method for surface stabilizing treatment of a semiconductor, particularly a silicon semiconductor device having more than one pn junction within the silicon semiconductor substrate, there has been well known to provide the surface of the substrate with a film of silicon dioxide.

The method for providing such $SiO_2$ film on the surface of the silicon substrate is broadly classified into two: the one is called "high-temperature oxidation method," in which silicon substrate is heated in an oxygen or water-vapour, thereby to oxidize the surface thereof; and the other is to deposit a silicon dioxide film obtained by pyrolytic decomposition, etc. of organo-oxy-silane on the surface of the silicon substrate.

The former method, in obtaining an $SiO_2$ film of a desired thickness (5,000–8,000 A.), requires heat-treatment at high temperature of 1,100–1,300° C. and for a long period of time; moreover, as the surface thickness of the silicon substrate is reduced due to oxidation, there inevitably takes place re-distribution phenomenon of p- or n-type impurities within the silicon substrate as well as changes in the surface state of the substrate, which bring about changes in the electrical characteristics of the silicon substrate.

Furthermore, in the surface part of the silicon substrate adjacent to the silicon dioxide film formed by the high-temperature oxidation method, there is formed a region called "channel" due to accumulation of more electrons than in other parts, which causes lowering of breakdown voltage at the pn junction as well as increase in leakage current. In general, the surface charge density of a silicon substrate to be formed beneath the $SiO_2$ film produced by the high temperature oxidation method is $2\text{–}5\times10^{12}/\text{cm.}^2$. At the present stage, the formation of channel is mainly considered due to the following reasons:

(1) intrusion into the $SiO_2$ film produced by the high temperature oxidation method of metallic ions such as $Na^+$, etc. in the course of formation of the oxide film;
(2) oxygen vacancy in the $SiO_2$ film;
(3) irregularities of crystals of the interface between the silicon substrate and the silicon dioxide film, etc.; and
(4) combination of the abovementioned various phenomena.

On the other hand, in the case of the latter method, wherein the $SiO_2$ layer is formed by the pyrolytic decomposition of organo-oxy-silane, the surface of the silicon substrate is not eroded by oxidation, and yet the temperature at which pyrolytic decomposition of organo-oxy-silane takes place ranges approximately from 700° C. to 800° C., which is remarkably lower than that in the case of the high temperature oxidation method. On account of this, it can hardly occur that, at a temperature at which the $SiO_2$ film is formed, the distribution of impurities caused by the impurity diffusion method within the silicon crystals does not undergo variation due to the phenomenon of re-diffusion of impurities within a solid body with the consequent change in electrical characteristics of the silicon semiconductor element. Also, when the vapour of organo-oxy-silane is made purer than as it is required, the reaction temperature will become sufficiently low with the result that amount of metallic ions such as $Na^+$, etc. can be reduced in the $SiO_2$ film to be deposited on the surface of the silicon substrate by pyrolytic decomposition of organo-oxy-silane. Accordingly, in the case of $SiO_2$ layer formed by the pyrolysis of organo-oxy-silane, the density of the channel formed at the interface between the silicon substrate and the silicon dioxide layer can be made lower by approximately ½ to ⅓ than that obtained by the high temperature oxidation method.

When the silicon dioxide film is to be formed on germanium semiconductor substrate by the pyrolytic decomposition of organo-oxy-silane, the carrier gas to be used is selected from among inactive gases such as nitrogen or argon containing no oxygen, because unstable film such as GeO or $GeO_2$ is formed on the surface of the germanium substrate of the pyrolytic temperature of organo-oxy-silane.

In the case of silicon semiconductor substrate, too, the carrier gas for the vapour of organo-oxy-silane is selected from among inactive gases such as nitrogen or the like. It should be noted that, even in deposition of $SiO_2$ film on the semiconductor substrate by the pyrolytic decomposition of organo-oxy-silane, when the film of silicon dioxide is coated on the surface of a diode element, the breakdown voltage of the diode becomes lowered.

SUMMARY OF THE INVENTION

It is therefore the primary object of the present invention to provide an improved method of coating a passivation film on the surface of a silicon substrate at a low temperature.

It is another object of the present invention to provide a method for production of a novel passivation film capable of compensating lowering of breakdown voltage of a pn junction due to coating the substrate with the passivation film.

In order to attain the abovementioned objects and other objects, the present invention proposes heat-treatment of a silicon substrate in an atmosphere of oxygen or an atmosphere containing oxygen at a temperature of 700–800° C. for 20–40 minutes prior to pyrolytic decomposition of organo-oxy-silane to form an $SiO_2$ film on the surface of a silicon substrate having more than one pn junction therewithin.

BRIEF DESCRIPTION OF DRAWING

For the better understanding of the invention, detailed explanations will be made hereinafter with reference to preferred embodiments thereof in conjunction with the accompanying drawings, in which.

DETAILED DESCRIPTION OF THE INVENTION

Figure 1:
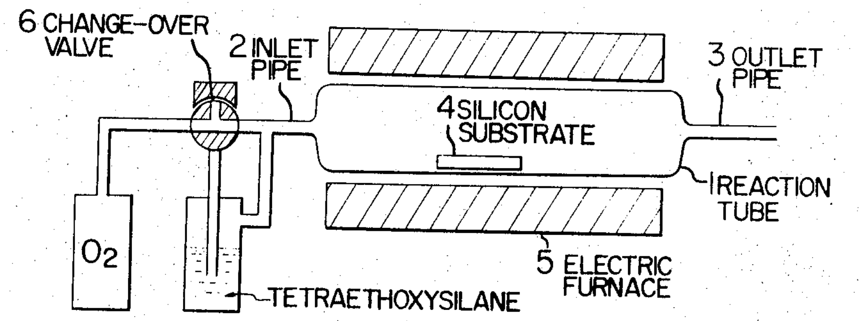
FIG. 1 is a schematic diagram showing an apparatus for depositing a silicon dioxide film on the surface of a silicon substrate by pyrolytic decomposition of organo-oxy-silane.

Referring to FIG. 1, the apparatus for depositing a silicon dioxide film on the surface of a silicon substrate is constructed by a reaction tube 1 made of quartz, an inlet pipe 2 connected to one end of the reaction tube, through which oxygen ($O_2$) and vapour of tetraethoxysilane flow into the reaction tube at all times, and an outlet pipe 3 connected to the other end of the reaction tube, through which the gases introduced into the reaction tube is exhausted outside thereof. A silicon semiconductor substrate 4, the details of which will be described hereinafter, is placed within the reaction tube 1, and then heated to a required temperature by an electric furnace 5 provided around the external circumference of the quartz tube.

Figures 2, 3:
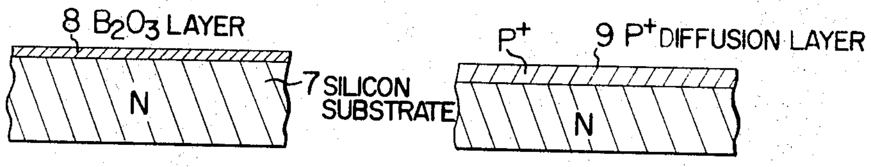
FIGS. 2 to 7 are diagrams explaining the process for producing a mesa-type diode in utilizing the method according to the present invention.

FIG. 2 shows an n-type silicon substrate 7 having resistivity of 100 ohm/cm., on one surface of which a layer 8 of $B_2O_3$ which is a p-type impurity is coated. This substrate is heated within a heat-treatment furnace at a temperature of 1200° C. for about 30 minutes, thereby forming a diffusion layer 9 of boron ($p^+$) on the coated surface of $B_2O_3$ adjacent to the n-type silicon substrate as shown in FIG. 3. Thereafter, this $p^+$ diffusion layer is subjected to etching into the mesa-type by an ordinary photo-etching process which is well known and utilized in the field of semiconductor industries.

Figure 4:
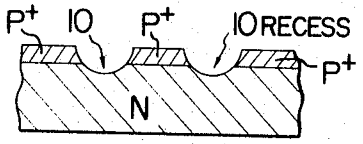
Figure 5:
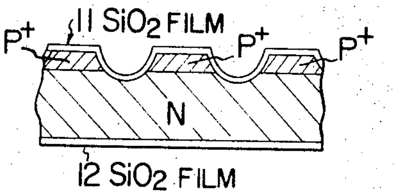
Figure 6:
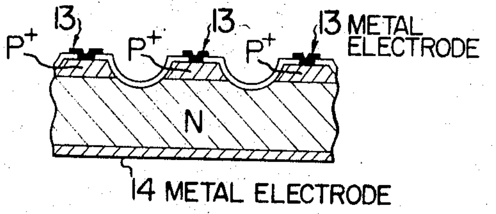

FIG. 4 indicates recesses 10 formed by the photo-etching process. Usually, a plurality of recesses 10 are formed on one semiconductor substrate, whereby the p diffusion layer is divided into multitude of sections. The surface of this silicon substrate 7 thus treated is then slightly etched in a mixture solution of $HNO_3$, HF, and $H_2O$ to remove dirt on the surface thereof, crystal distortions, etc., after which the silicon substrate is placed within the reaction furnace as shown in FIG. 1 where it is heat-treated at a temperature of 780° C. for 20 minutes, while feeding oxygen into the furnace at a rate of 0.5 l./min. in accordance with the prescribed method. Subsequently, a valve 6 is changed over to admix vapour of tetraethoxysilane into the oxygen gas and the mixture of the gas and vapour is continuously fed into the reaction furnace for about 30 minutes. By this operation, silicon dioxide films 11, 12 of approximately 1 micron thick are formed on the surface of the silicon substrate, as shown in FIG. 5. Again, the valve 6 is adjusted to cause only oxygen to flow into the reaction furnace and, at the same time, the temperature of the furnace is gradually lowered to a room temperature. When the silicon substrate has cooled down sufficiently, it is taken out of the furnace. Next, by the photoetching process, the silicon dioxide film on the $p^+$ diffusion layer as well as on the back side of the n-type silicon substrate is completely removed, on which metal electrodes 13, 14 are fitted by the known methods such as, for example, evaporation deposition, plating, and so forth, as shown in FIG. 6. Thereafter, the entire body of the substrate thus treated is cut at the portion of the recesses 10 to be separated into a unit piece of the diode element. The unit diode thus obtained is shown in FIG. 7.

Figure 7:
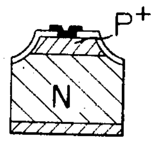
Figure 8:
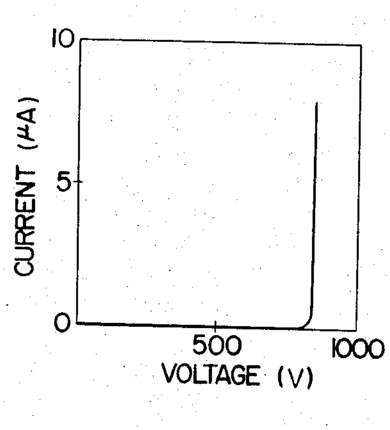
FIG. 8 is a graphical representation showing a voltage versus current characteristics of the diode shown in FIG. 7.

The current-voltage characteristic curve of the diode shown in FIG. 7 is represented in FIG. 8. The characteristic curve indicates that it has no substantial difference from that of the diode which is not coated with the silicon dioxide film. This signifies that the current-voltage characteristics of a diode is not deteriorated even if it is coated with the silicon dioxide film.

Figure 9:
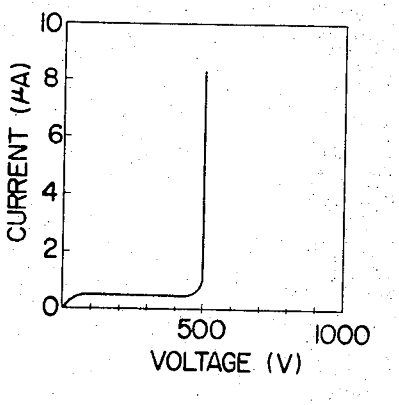
FIG. 9 is a voltage versus current characteristic curve in the case of coating a mesa-type silicon diode with a silicon dioxide film obtained by conventional method of pyrolytic decomposition of organo-oxy-silane.

FIG. 9 is a current-voltage characteristics curve in the reverse direction in case an $SiO_2$ film is directly coated on a semiconductor substrate from the pyrolytic decomposition of organo-oxy-silane without subjecting the substrate to the heat-treatment in an oxyen atmosphere according to the present invention. It is clear from this graphical representation that, when the semiconductor substrate is not treated by the method of the present invention, the semiconductor element inevitably brings about lowering of its breakdown voltage as well as increase in leakage current.

It has also been verified that, when the above-mentioned experiment is conducted on a germanium diode element, its breakdown voltage lowered in case of an $SiO_2$ film being directly coated by the pyrolytic decomposition of organo-oxy-silane without pre-heating. Accordingly, heat-treatment of the silicon semiconductor substrate in an oxygen atmosphere or in an atmosphere containing oxygen prior to coating the silicon dioxide film on the surface of the substrate by the pyrolytic decomposition of organo-oxy-silane is considered to be of great significance in compensating lowering of the breakdown voltage of the pn junction and increase in leakage current.

Figure 10:
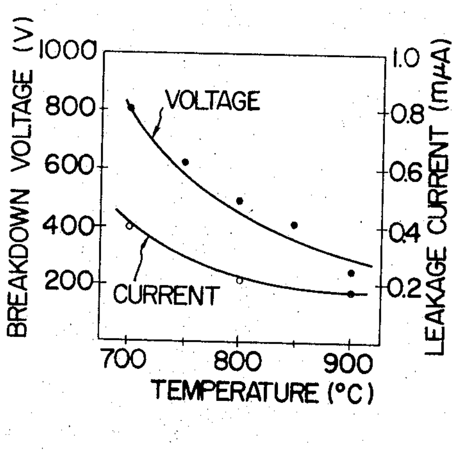
FIG. 10 is a graphical representation showing relationship among heat-treatment temperature, breakdown voltage, and leakage current of a diode, when a silicon substrate is heat-treated in an oxygen prior to formation of a silicon dioxide film to produce the silicon diode element shown in FIG. 7.
Figure 11:
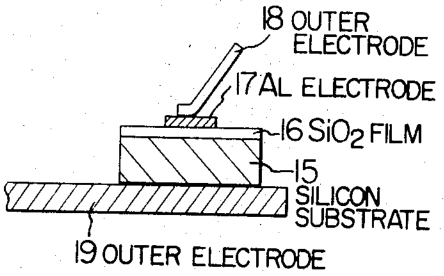
FIG. 11 is a sectional view in longitudinal direction of an MOS type semiconductor element produced for the purpose of examining the effect of the present invention.
Figure 12:
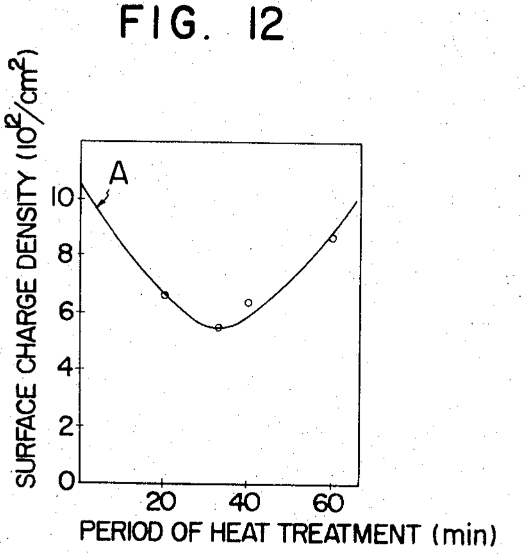
FIG. 12 is a graphical representation showing relationship between the time period of heat-treatment and the surface charge density of the semiconductor element in an oxygen atmosphere before an $SiO_2$ film is deposited thereon.

FIG. 10 indicates results of experimentation as to influence of the temperature for the heat-treatment of a mesa type pn-junction diode element shown in FIG. 7 on its reverse voltage and leakage current when the diode element is heat-treated in an oxygen atmosphere and an atmosphere containing oxygen prior to the element being coated with an $SiO_2$ film on its surface by the pyrolytic decomposition of organo-oxy-silane. As will be apparent from the graphical representation, the appropriate temperature for the heat-treatment in an oxygen atmosphere or an atmosphere containing oxygen ranges from 700° C. to 800° C. Higher temperature than this range will bring about lowering of the characteristics of the diode, and lower temperature than this range also causes deterioration of the diode characteristics. One of the causes of deterioration in the diode characteristics is considered due to surface charge density ($N_{BF}$) existing at the interface between the silicon semiconductor substrate and the silicon dioxide film adjacent thereto (Si—$SiO_2$ interface). In order therefore to examine the influence of surface carrier density, on the diode element, a number of MOS type diode elements as shown in FIG. 11 are produced and examined under various treatment conditions. As is clear from the sectional view of FIG. 11, the MOS type diode element is constructed by a silicon semiconductor element 15 of n-type conductivity having resistivity of 100 ohm/cm. as well as dimension of 2 x 2 x 0.1 $mm.^3$, an $SiO_2$ film 16 of 0.5 micron thick formed on the surface of the silicon substrate by the pyrolytic decomposition of organo-oxysilane after the substrate is heat-treated in an oxygen atmosphere or an atmosphere containing oxygen, an aluminum electrode 17 of 1.0 mm. in diameter formed in a vacuum deposition device, and outer electrodes 18 and 19 fitted on both sides of the aluminum electrode 17 and the other surface of the semiconductor substrate. This MOS type diode element is heat-treated at a temperature of 780° C. in an oxidizing atmosphere prior to formation of an $SiO_2$ film on the surface thereof and the relationship between the heat-treatment time and the surface charge density was observed. The result is as shown in FIG. 12. It will be clear from this graphical representation that the surface charge density can be made minimum when the heat-treatment is conducted for 20–40 minutes at a temperature of 700° C. to 800° C. in an oxygen atmosphere or an atmosphere containing oxygen prior to formation of the silicon dioxide film by the pyrolytic decomposition of organo-oxy-silane. In FIG. 12, the point A indicates the surface charge density appearing at the interface between the silicon substrate and the silicon dioxide film in case the oxide film is coated on the substrate directly from pyrolytic decomposition of organo-oxy-silane without subjecting the substrate to a heat-treatment in an oxygen atmosphere.

From the foregoing, the optimum ranges for the heat-treatment conditions according to the present invention are at a temperature of 700° C. to 800° C. and for a heating time of 20 to 40 minutes in an atmosphere of oxygen or that containing oxygen. This range is a very limited range in obtaining favorable results. Outside this range, the degree of the results to be obtained simply lowers down gradually, not that the above-mentioned results cannot be expected at all.

Figure 13:
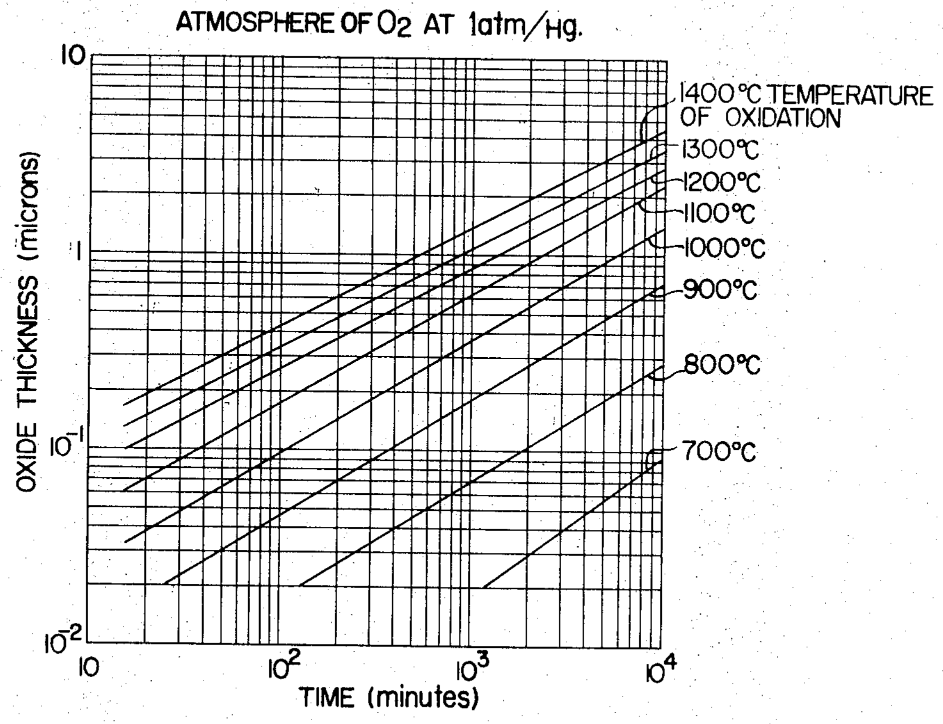
FIG. 13 is a graphical representation showing relationship among thickness of oxide film to be formed on the surface of a semiconductor element, heat-treatment temperature, and heat-treatment time, in case a silicon semiconductor crystal is heated in an atmosphere containing oxygen.

FIG. 13 indicates the ratio of production of silicon dioxide film formed on the surface of a silicon semiconductor element, when it is heat-treated in a dry oxygen. From this graph, the thickness of the silicon dioxide film formed by the method of this invention can be found out to be less than 100 A. Therefore, in the present invention, heat-treatment of a silicon semiconductor element at a temperature of 700° C. to 800° C. for 20 to 40 minutes in an oxidizing atmosphere is indispensable for stabilizing the electrical characteristics of the semiconductor element. This treatment is entirely different from compulsory oxidation of the surface of the silicon element.

The following table shows a comparison between the electrical characteristics of a planar transistor of known type immediately after it is manufactured, and the electrical characteristics of the transistor, from which surface a silicon dioxide film is removed by etching, then a heat-treatment is effected at a temperature of 780° C. for 20 minutes in an oxygen atmosphere, followed by formation of $SiO_2$ film by the pyrolytic decomposition of organo-oxy-silane.

| | Breakdown voltage, $V_{CBO}$ | Leakage Current, $I_{EBO}$ |
|---|---|---|
| Planar transister | 30 Volts | 150$\mu\mu$ A. |
| Transister treated in oxygen for 20 minutes | 42 Volts | 85$\mu\mu$ A. |

From the above comparison table, it will be apparent that remarkable effect can be obtained from the present method, when it is applied to transistors.

It is also possible that, after the silicon semiconductor element is heat-treated in an oxygen atmosphere or an atmosphere containing oxygen in accordance with the present invention, oxygen supply is stopped and the reaction furnace is drawn to a vacuum of about $10^{-1}$ mm. Hg, into which vapour of tetraethoxysilane is introduced (vapour pressure of tetraethoxysilane is about 1.3 mm. Hg at 10° C.) for the pyrolytic decomposition, thus the silicon dioxide film is deposited on the surface of the semiconductor element.

We claim:

1. A method for treating the surface of semiconductor devices which comprises, heat-treating a silicon semiconductor substrate having at least one pn-junction in an oxidizing atmosphere at a temperature of 700° C. to 800° C. for 20 to 40 minutes to form a thick oxide layer of approximately 100 angstroms on the surface thereof; and then placing the silicon semiconductor substrate in an atmosphere containing organo-oxy-silane to deposit a silicone dioxide film on said thin oxide film due to pyrolytic decomposition of said organo-oxy-silane.

2. The method according to claim 1, wherein the oxidizing atmosphere is oxygen alone.

3. The method according to claim 1, wherein said pyrolytic decomposition is carried out in an atmosphere of organo-oxy-silane and oxygen.

References Cited

UNITED STATES PATENTS

| | | | |
|---|---|---|---|
| 2,802,760 | 8/1957 | Derick et al. | 117—201 XR |
| 3,093,507 | 6/1963 | Lander et al. | 117—201 |
| 3,158,505 | 11/1964 | Sandor | 117—215 |
| 3,298,875 | 1/1967 | Schink | 148—174 XR |
| 3,304,200 | 2/1967 | Statham | 117—201 |

WILLIAM L. JARVIS, Primary Examiner

U.S. Cl. X.R.

117—215, 106; 148—174